United States Patent [19]

King

[11] 3,996,599

[45] Dec. 7, 1976

[54] IMAGE DETECTOR WITH BACKGROUND SUPPRESSION

[75] Inventor: Gerard J. King, Alexandria, Va.

[73] Assignee: The United States of America as represented by the Secretary of the Army, Washington, D.C.

[22] Filed: Mar. 19, 1975

[21] Appl. No.: 559,855

[52] U.S. Cl. .................................. 357/30; 357/24; 357/58; 250/338; 250/370
[51] Int. Cl.² ................. H01L 27/14; H01L 31/00; H01L 29/78; H01L 29/12
[58] Field of Search .......................... 357/24, 30, 32

[56] References Cited
UNITED STATES PATENTS 3,845,295   10/1974   Williams et al. .................... 357/24

Primary Examiner—William D. Larkins
Assistant Examiner—Gene M. Munson
Attorney, Agent, or Firm—Nathan Edelberg; John E. Holford; Robert P. Gibson

[57] ABSTRACT

A balanced metal-oxide-semiconductor detector is provided which senses only the difference in radiation level between elements of a radiation image. The same detector is provided in a silicon base structure modified to be responsive to band-gap energy at longer wavelengths than are normally associated with such structures.

3 Claims, 5 Drawing Figures

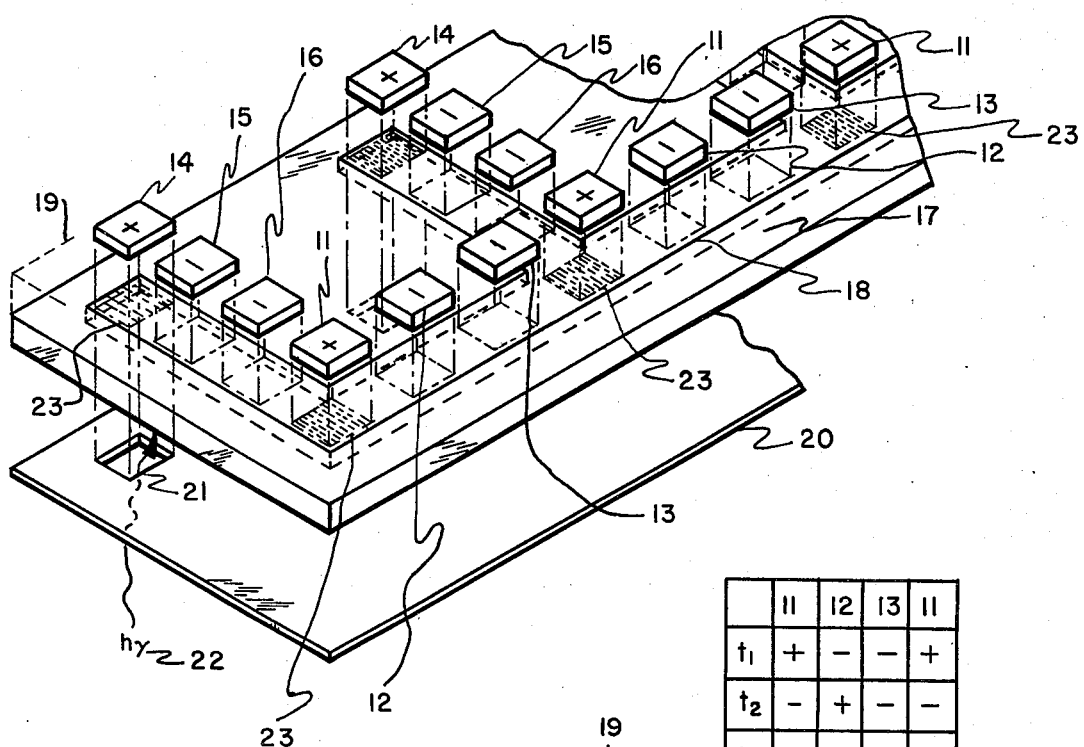
FIG. 1
FIG. 2
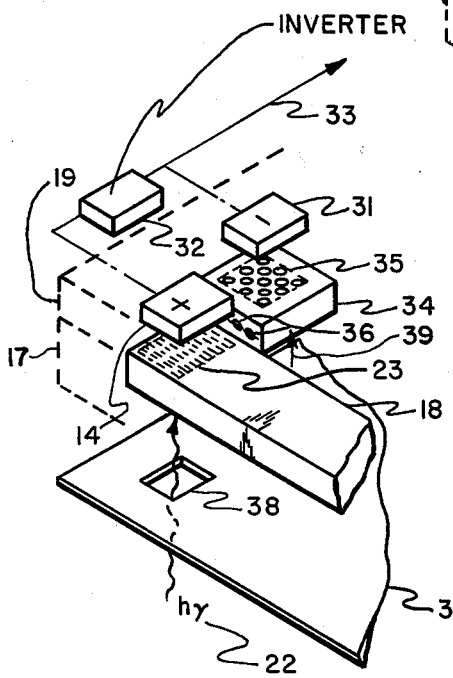
FIG. 3
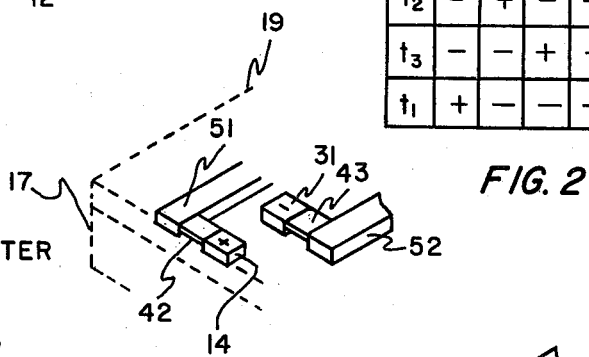
FIG. 5
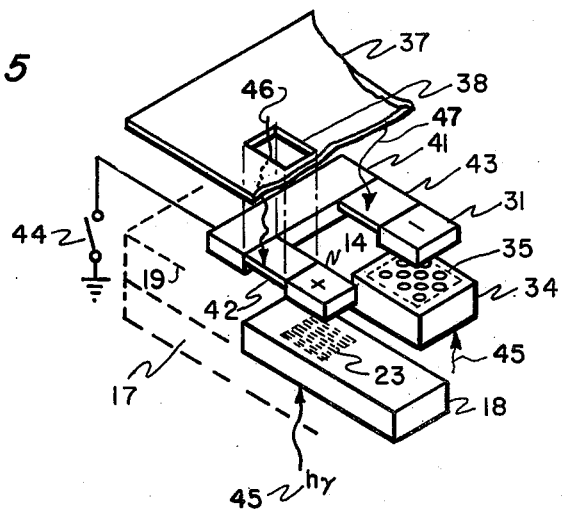
FIG. 4

IMAGE DETECTOR WITH BACKGROUND SUPPRESSION

The invention described herein may be manufactured, used, and licensed by or for the Government for governmental purposes without the payment to me of any royalty thereon.

BACKGROUND OF THE INVENTION

One of the most popular devices involved in large scale integration (LSI) of electronic semiconductor circuits is the Metal-Insulator-Semiconductor (MIS) device or more specifically the Metal-Oxide-Semiconductor (MOS) device. Originally LSI' technology was used to fabricate Field Effect Transistors (MOSFETS, IGFET, etc.) but more recently it is been applied to Charge-Coupled-Devices (CCDs), which incorporate integral photon detectors. The mechanism whereby storage of photon-produced minority charge carriers occurs in a surface depletion or inversion region of an MOS or MIS device is described by S. M. Sze in *Physics of Semiconductor Devices* published by J. Wiley 1969, pg. 486 and A. S. Grove in *Physics and Technology of Semiconductor Devices* also published by J. Wiley 1967. A description of charge coupled devices is given by G. F. Amelio, W. J. Betram, Jr. and M. F. Tompesett in the article "Charge Coupled Imaging Devices: Design Considerations" published in the *IEEE Transactions on Electron Devices*, Vol. ED-18, No. 11, Nov. 1971.

Theoretically charge coupled devices can be made from various semiconductor materials, so that the photoelectric effect can be extended to any spectral region for which a band-gap material exists. Actually; considering temperature dependence, structural stability, eash of fabrication and cost; the most practical base material is silicon, which limits the devices to rather high photon energies at the top of the visible spectrum. This is too restrictive for image intensifiers and thermal imaging devices which operate into the infrared region and far-infrared regions. Regardless of the material used, these devices have a further limitation in that their charge storage capability per unit area is orders of magnitude less than the maximum charge produced by a typical 3–5 micron detector now used in image intensifiers. The high level of charge is due to very high average levels of background signal. A few schemes have been advanced for lowering the average signal level including a.c. coupling and background subtraction (d. c. biasing), but these have involved complicated scanning and/or reductions in the useful signal.

BRIEF DESCRIPTION OF INVENTION

An object of the present invention is, therefore, to provide an improved CCD for an image intensifier or thermal image detector capable of handling high average photon fluxes and providing maximum contrast of the scene presented.

A further object of the invention is to provide a silicon base CCD of the type described above which is sensitive to photon energies lower than the bandgap energies provided by any of the doped structures currently available in silicon base devices.

BRIEF DESCRIPTION OF THE DRAWINGS

These and other objects of the invention are best understood with reference to the accompanying drawings wherein:

FIG. 1 shows a CCD structure according to the prior art;

FIG. 2 shows the polarity of voltages on successive electrodes of FIG. 1 between charge transfer periods or at the time of maximum positive polarity when three phase sinusoidal voltages are applied;

FIG. 3 shows a first embodiment of a detector according to the present invention for use with appropriate base materials;

FIG. 4 shows a second embodiment of a detector according to the present invention for use with any type of base material; and FIG. 5 shows a different embodiment of the FIG. 4 structure wherein the busing between gate electrodes is modified.

DESCRIPTION OF THE INVENTION

Referring specifically to FIG. 1 there is shown a Charge-Coupled-Device (CCD) of the prior art an improved embodiment of which is one object of the present disclosure. This device consists essentially of a plurality of insulated gate electrodes 11-16 with those electrodes of the same number directly interconnected (not shown). An insulating layer 19 supports the electrodes and separates them from a doped semiconductor channel 18. Channel 18 is diffused or otherwise formed into the intrinsic semiconductor base 17. As an example the channel may be either p-type or n-type silicon depending on whether electrons or holes are to be collected under the gate electrodes, and base i-type silicon. The top and sides of the device are shielded from light, usually by the body of the camera or other device in which it is used. The lower face is covered by an opaque screen 20 the term opaque as used herein including infrared radiation, with windows 21 under electrodes 14. The scene to be viewed is projected as a beam of photons on the side of screen 20 opposite the CCD. A sample of photons 22 passing through windows 21 create electron-hole pairs in channel 18. When a positive voltage with respect to the base 17 is present on electrode 14 electrons collect at the interface of layers 19 (assuming that the minority charge carriers in channel 18 are electrons) and 18 to form an electronic charge shadow 23 under that electrode. If electrode 14 is made transparent to photons 22 the shield can be used on the top side of the CCD with the camera body shading the bottom, assuring of course that the electrodes are properly insulated from both. To transfer the charge stored by electrodes 14 three phase balanced voltages are applied to all the electrodes in proper sequence.

FIG. 2 shows the polarity of voltages appearing on the electrodes as each successive positive maximum occurs in the system. When sinusoidal voltages are used the intervening negative voltages are each half their peak value and varying inversely with time. It is readily seen that any charge present will smoothly pass from electrode 11 past electrodes 12 and 13, in numerical sequence, to the next electrode 11. A similar synchronized sequence of events transfers charge from electrode 14 past electrodes 15 and 16 to electrode 11. This latter sequence is gated on for one cycle for every $n$ cycles of electrodes 11, where $n$ is number of electrodes 11 present. The row of electrodes 14 detects one line in the image. Additional lines can be obtained by moving the image one line every $n$ cycles or by providing additional detectors with parallel or serial readout of the charge (current) pulses.

FIG. 3 shows one embodiment of applicant's novel arrangement. A novel detector element which replaces the detector element of FIG. 1 and imposes a further limitation on the voltages supplied as well as on the placement of the screen element 20 from FIG. 1. The detector requires a second electrode 31 closely adjacent, but not touching, each electrode 14. The electrodes 31 are supplied with a voltage of opposite polarity to that impressed on electrodes 14, as provided by a suitable inverter circuit 32 many of which are well known in the art. All the electrodes 31 are intercoupled by suitable conductors represented by lead 33. An island 34 of doped semiconductor opposite in type to that of channel 18 is diffused or otherwise formed in the base semiconductor under each of the electrodes 31. The size of the island 34 and its spacing is best determined experimentally by subjecting the underside (or top if transparent electrodes are used) of elements 18 and 34 to a uniform source of radiation and measuring the charge buildup under electrodes 14 and 31. Mutual attraction will cause the charges to conduct through the intrinsic semiconductor, which is the only material between island 34 and channel 18, leaving a net charge on one or the other. The net charge is negligible compared to the maximum storage capability of channel 18 (under the electrode tested) and hence channel overload is prevented. The screen 37 is similar to screen 20 except that it must be thermally separated from the base semiconductor and it must be an excellent heat conductor. The screen, for example, may have only its edge bonded to the edge of the base 17 well away from the channel 18. With the screen so placed the charge 35 under electrode 31 accumulates due to the uniform radiation of photons 39 from the screen while that under electrode 14 responds to radiation from a specific window element 38 in the screen. The temperature of the screen will be close to the average background temperature of the scene so that the net difference in charge stored will be small. In order to insure that the net charge always appears under electrode 14 the balance between the positive and negative voltages on either side of the inverter may be made adjustable by any of the many available voltage dividers well known in the art. The divider would natrually be a part of the inverter which in turn may be a part of a commercially available voltage regulated power supply. Alternatively the temperature of the screen may be varied by coupling it to any conventional heater or cooler. The semiconductor elements being separate can be cooled independently, if desired, to improve the signal to noise ratio.

FIG. 4 shows an embodiment similar to the FIG. 3 structure, but designed for detecting photons with energies too small to overcome the bandgap of the semiconductors in the channel and base. A common conductor 41 is provided in parallel spaced relationship with electrodes 14 and 31 and insulated from the semiconductor structure. Bridges of photoconducting material sensitive to infrared or far infrared radiation such as 42 and 43 electrically interconnect both types of electrodes to the common channel. Switch 44, which must be cyclically operated at the line scan rate when the detector is employed in a CCD, couples the common conductor to ground between readout periods of the CCD. At the end of each readout period a short voltage pulse is applied to each type electrode shown in FIG. 4 having the polarity illustrated. The semiconductor structure is constantly radiated with a flux of photons 45 sufficiently energetic to induce electron-hole pairs therein and sufficiently dense enough to saturate the capacitor structures. When switch 44 closes to begin a signal storage cycle the charge leaks to ground (base 17) at a rate dependent on the photons 46 from the scene that strike the photoconductor 42 or similar photons 47 emitted by the screen 37 that strike photoconductor 43, these latter photons can obviously be far less energetic than photons 45. Otherwise the device operates as the FIG. 3 device. The stored charge carriers in channel 18 and island 34 recombine during the storage cycle until a net charge remains on one or the other.

A net charge in channel 18 indicates that the element of the scene is cooler than the screen and the inverse if a net change is left on island 34. As before the magnitude of the voltages applied to electrodes 14 and 31 or the temperature of screen 37 can be adjusted to insure that the net change always appears in channel 18.

FIG. 5 shows a slightly different embodiment of part of the structure shown in FIG. 4. Instead a single ground conductor, two voltage busses 51 and 52 can be coupled to electrodes 14 and 31 through photoconductors 42 and 43. These voltages would be applied over the entire storage cycle as in the FIG. 3 device. The capacitors would then charge rather than discharge in accordance with the low energy photons striking the photoconductors. The photoconductors may be gallium phosphide or any similar type material.

While applicant's devices have been described as one of perhaps hundreds of unipolar output elements in a CCD environment, a single balanced device in which the bipolar signal between channel 18 and island 34 is extracted makes the most efficient use of the device. The charge storage capability of an MIS device is limited by the nature of the storage process to about $10^5$ signal charge carriers (either holes or electrons) for a 1 mil square 1000 A thick silicon-silicon dioxide structure. Assuming 50% efficiency for the production of charge carriers and similar efficiency for the collection of minority charge carriers, a typical 3–5 micron infrared detecting MIS device will be required to store approximately $10^{15}$ charge carriers per square centimeter per second. The maximum charge which can be stored per square centimeter on a silicon MOS with a 1000A thick oxide is approximately $2.2 \times 10^{11}$ charges per volt applied. Maximum allowable voltage without breakdown would put an upper limit of about 10 volts or $2.2 \times 10^{12}$ charges. An indium antimonide MIS would have a similar limiting storage capacity of about $5 \times 10^{12}$ charges per square centimeter. Thus it is obvious that the dynamic range of the signal must be reduced drastically. Total background signal suppression is therefor a most rewarding feature in this type of viewing system. Completely balanced single element detector may be used with mechanical scanning systems where both horizontal and vertical scanning is done by moving reflectors. The completely balanced detectors can also be applied to a pair of separate and complimentary CCDs, i.e. where the islands 34 form the finger a second readout channel extending to the left in FIGS. 3 and 4 and the electrodes of which are all driven by inverted voltages relative to those shown in FIG. 2. As is well known the outputs so obtained are suitable to drive a push-pull amplifier. In such an arrangement elements 31, 43, 41, 51 and 52 of FIG. 4 could for convenience be superposed sandwich fashion with the upper most electrodes transparent or arranged to pass infrared to the photocathodes, in order to avoid adding additional layers of insulator.

Obviously many other variations of the structures described above will immediately be obvious to those skilled in the art, but the invention is limited only as defined in the claims which follow.

I claim:

1. A detector for sensing and storing the amplitude of one or more flux samples from a beam of incident photons comprising:
- a base layer of an intrinsic semiconductor;
- a pair of separate channels of doped semiconductor formed into said base layer, having exposed surfaces coplanar with one surface thereof, said channels having majority and minority charge carriers of opposite conductivity types;
- a thin layer of insulating material attached to and covering said coplanar surfaces;
- at least a first pair of separate but closely adjacent planar gate electrodes mounted on said insulating layer so that each electrode covers an underlying surface portion of a different one of said channels:
- voltage generating means electrically coupled to each said pair of electrodes for applying alternating bias voltage pulses of opposite polarity thereto relative to the voltage of said base;
- an opaque structure surrounding said detector including a thin conducting screen substantially spaced from and parallel to said base layer and electrodes, except at the edges thereof, said screen having windows therein adjacent to said underlying said surface portions of only one of said pair of channels, whereby charge carriers of one polarity are periodically generated and stored under electrodes in said one channel in direct proportion to flux samples admitted by said windows and carriers of the opposite polarity are simultaneously stored under electrodes in the remaining channel in direct proportion to the radiation temperature of the screen;
- said channels being so closely spaced that carriers stored simultaneously under said closely adjacent electrodes are drawn by mutual attraction into said base layer and recombine, leaving substantially only a net charge on one electrode; and
- readout means electrically coupled to said electrodes to periodically store the amplitude of said net charge.

2. A detector for sensing and storing the amplitude of one or more flux samples from a beam of incident photons comprising:
- a base layer of an intrinsic semiconductor;
- at least a first pair of separate channels of doped semiconductor formed into said base layer, having exposed surfaces coplanar with one surface thereof, said channels having majority and minority charge carriers of opposite conductivity types;
- a thin layer of insulating material attached to and covering said coplanar surfaces;
- at least a first pair of separate but closely adjacent planar gate electrodes mounted on said insulating layer so that each electrode covers an underlying surface portion of a different one of said channels;
- voltage generating means electrically coupled to said pair of electrodes for applying alternating bias voltage pulses of opposite polarity thereto relative to the voltage of said base;
- a separate planar photoconductor coupled at one end to each of said electrodes having an energy bandgap less then said doped semiconductor;
- a cyclically operated switch means connected between the remaining end of each of said photoconductors and said base layer for connecting said remaining end to said base when the polarity of said electrode is opposite that of the minority carriers in its underlying channel;
- means coupled to said base layer to constantly irradiate said base layer with photons having energies greater than the energy bandgap of said doped semiconductor;
- an opaque structure surrounding at least said photoconductors including a thin heat conducting screen equallly spaced from and parallel to said photoconductors, said screen having a window therein adjacent to the photoconductors associated with only one of said pair of channels, whereby charge carriers of one polarity are periodically generated and stored under electrodes in said one channel in direct proportion to flux samples admitted by said windows and carriers of the opposite polarity are simultaneously stored under electrodes in the remaining channel in direct proportion to the radiation temperature of the screen;
- said channels being so closely spaced that carriers stored simultaneously under said closely adjacent electrodes are drawn by mutual attraction into said base layer and combine, leaving substantially only a net charge on one electrode; and
- readout means electrically coupled to said electrodes to periodically store the amplitude of said net charge.

3. A detector for sensing and storing the amplitude of one or more flux samples from a beam of incident photons comprising:
- a base layer of an intrinsic semiconductor;
- a pair of separate channels of doped semiconductor formed into said base layer, having exposed surfaces coplanar with one surface thereof, said channels having majority and minority charge carriers of opposite conductivity types;
- a thin layer of insulating material attached to and covering said coplanar surfaces;
- at least a first pair of separate but closely adjacent planar gate electrodes mounted on said insulating layer so that each electrode covers an underlying surface portion of a different one of said channels;
- a planar photoconductor electrically coupled to each of said electrodes;
- voltage generating means electrically coupled through said photoconductors to said pair of electrodes for applying alternating bias voltage pulses of opposite polarity thereto relative to the voltage of said base;
- an opaque structure surrounding at least said photoconductors including a thin heat conducting screen equally spaced from and parallel to said photoconductors, said screen having a window therein adjacent to said photoconductors associated with only one of said pair of channels, whereby charge carriers of one polarity are periodically generated and stored under electrodes in said one channel in direct proportion to flux samples admitted by said windows and carriers of the opposite polarity are simultaneously stored under electrodes in the remaining channel in direct proportion to the radiation temperature of the screen;
- said channels being so closely spaced that carriers stored simultaneously under said closely adjacent electrodes are drawn by mutual attraction into said base layer and recombine, leaving substantially only a net charge on one electrode; and
- readout means electrically coupled to said electrodes to periodically store the amplitode of said net charge.

* * * * *